(12) United States Patent
Yamanobe (10) Patent No.: US 6,579,753 B2
(45) Date of Patent: Jun. 17, 2003

(54) METHOD OF FABRICATING A SEMICONDUCTOR STORAGE DEVICE HAVING A TRANSISTOR UNIT AND A FERROELECTRIC CAPACITOR

(75) Inventor: Tomomi Yamanobe, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/769,426

(22) Filed: Jan. 26, 2001

(65) Prior Publication Data

US 2002/0033493 A1 Mar. 21, 2002

(30) Foreign Application Priority Data

Sep. 21, 2000 (JP) .................................. 2000-287400

(51) Int. Cl.[7] .......................................... H01L 21/8242
(52) U.S. Cl. ........................ 438/240; 438/210; 438/250; 438/253
(58) Field of Search ........................... 438/240, 210, 438/239, 250, 253, 254, 256, 622; 257/310

(56) References Cited

U.S. PATENT DOCUMENTS

| | | | | |
|---|---|---|---|---|
| 5,122,923 A | * | 6/1992 | Matsubara et al. | 361/321 |
| 5,142,437 A | * | 8/1992 | Kammerdiner et al. | 361/313 |
| 5,330,931 A | * | 7/1994 | Emesh et al. | 437/60 |
| 5,555,486 A | * | 9/1996 | Kingon et al. | 361/305 |
| 5,930,639 A | * | 7/1999 | Schuele et al. | 438/396 |
| 6,165,802 A | * | 12/2000 | Cuchiaro et al. | 438/3 |
| 6,200,821 B1 | * | 3/2001 | Baek | 438/3 |
| 6,214,660 B1 | * | 4/2001 | Uemoto et al. | 438/240 |
| 6,232,131 B1 | * | 5/2001 | Nagano et al. | 438/3 |
| 6,294,805 B1 | * | 9/2001 | Jung | 257/295 |
| 6,417,101 B2 | * | 7/2002 | Hong | 438/660 |
| 2001/0013614 A1 | * | 8/2001 | Joshi et al. | 257/295 |

FOREIGN PATENT DOCUMENTS

| | | |
|---|---|---|
| JP | 8-502859 | 3/1996 |
| JP | 08162619 | 6/1996 |
| JP | 09289291 | 11/1997 |
| JP | 10012844 | 1/1998 |
| JP | 10189886 | 7/1998 |
| JP | 10-209392 | 8/1998 |
| JP | 2000-68463 | 3/2000 |
| JP | 2000-82683 | 3/2000 |
| JP | 2000-236071 | 8/2000 |
| JP | 2000-252444 | 9/2000 |

* cited by examiner

Primary Examiner—Tom Thomas
Assistant Examiner—Douglas W. Owens
(74) Attorney, Agent, or Firm—Venable LLP.; Michael A. Sartori; Jeffrey W. Gluck (57) ABSTRACT

An inventive method of forming a Ti film above an oxide material electrode in a semiconductor device involves forming a contact hole to an upper electrode and a lower electrode, forming a TiN film by a sputtering method, then remaining TiN film on the bottom of the contact when, by a lift off method, the other TiN film is removed. Forming of $TiO_x$ on the oxide material electrode and peeling can thereby be prevented. The bottom of the diffusion layer contact to a diffusion layer is formed by the multilayer metal of Ti film and Al film; a loose contact with a Si substrate can thereby be prevented.

10 Claims, 6 Drawing Sheets

METHOD OF FABRICATING A SEMICONDUCTOR STORAGE DEVICE HAVING A TRANSISTOR UNIT AND A FERROELECTRIC CAPACITOR

BACKGROUND OF THE INVENTION

1. Field of the Invention

The present invention relates to a semiconductor storage device and a manufacturing method therefor. More particularly, the present invention relates to a semiconductor storage device which uses a ferroelectric capacitor formed by sandwiching a ferroelectric material between electrodes and a manufacturing method therefor.

2. Description of the Related Art

A ferroelectric material, that is a material having a spontaneous polarization that can be inverted by electric field (ferroelectric domain inversion) has been studied and proposed to be used for a semiconductor storage device. A ferroelectric memory, using a ferroelectric capacitor where a thin film of ferroelectric material is sandwiched between an upper electrode and a lower electrode, has already been developed.

This ferroelectric material memory is composed of a ferroelectric material capacitor and a transistor unit. The ferroelectric capacitor is constructed from a thin ferroelectric film that is sandwiched between an upper electrode and a lower electrode, made with metal having a high melting point, such as Platinum (Pt) or the like. The transistor unit is formed on a silicon substrate by an original method. A direction connection or a direct contact via aluminum (Al) is generally used for an electric contact between the ferroelectric capacitor unit and the transistor unit.

On the other hand, it is known that frequent repetition of ferroelectric domain inversion deteriorates the characteristics of a ferroelectric thin film, which is the main material of the ferroelectric capacitor. This deterioration of characteristics is a phenomenon of the decrease in spontaneous polarization value, the so-called fatigue. This phenomenon is caused by an oxygen defect in the ferroelectric thin film contacting the electrode caused by the frequent repetition of ferroelectric domain inversion. When oxygen in the ferroelectric thin film becomes defective, a decrease of spontaneous polarization value is reported.

Pt, mainly used for the electrodes, is catalytically active. This Pt accelerates damage to the ferroelectric thin film by nascent hydrogen during the semiconductor processes. The nascent hydrogen of an interlayer dielectric is formed or a sinter that increases a transistor characteristic deoxidizes the ferroelectric material and deteriorates the characteristic of the ferroelectric material.

To prevent the deterioration-described above, material for the upper electrode of the ferroelectric capacitor should be carefully selected. Recently, material catalytically inactive has been selected for the material of the upper electrode. Furthermore, conductive oxide material containing oxygen has been selected for the upper electrode.

By selecting a conductive oxide material containing oxygen, damage by hydrogen in the subsequent processes can be prevented. On the other hand, oxygen provided from the conductive oxide electrode to the ferroelectric thin film compensates the oxygen in the ferroelectric thin film defected by the frequent ferroelectric domain inversion and the undesirable fatigue of the characteristics can be improved.

It is difficult to form a connection between the oxide electrode and a diffusion layer of silicon substrate with the Al material. It was normally necessary to form a Ti film above the diffusion layer in order for good contact to be formed between the Al material and the diffusion layer of the silicon substrate. It is necessary to form a Ti film for a few ten nm thicknesses above the diffusion layer using a sputter method or the like. The Ti film is naturally formed on the upper oxide electrode as well. This Ti film is characteristically easy to oxidize. Application of a rapid heat treatment is required after the formation of the Ti film. This heat treatment causes the Ti film to react with the oxide material electrode and form a $TiO_X$ film, which is an insulator. This $TiO_X$ film can cause a loose connection. Moreover, when the Ti film is oxidized and $TiO_X$ is formed, it expands to twice the volume of the original Ti film. Adhesion between the Ti film and the conductive oxide electrode deteriorates. When nitride Ti (TiN) and Al material is formed in subsequent processes, there is a problem that peeling of the Ti film will occur.

SUMMARY OF THE INVENTION

Therefore, it is an object of the present invention to provide a semiconductor storage device together with its manufacturing method which overcomes the above difficulties accompanying the conventional art.

To achieve the object described above, semiconductor storage device and its manufacturing method according to the first aspect of the present invention, a semiconductor storage device includes a lower electrode made of a high melting point metal, an upper electrode made of conductive oxide, a ferroelectric capacitor made of a ferroelectric material film sandwiched between the lower electrode and the upper electrode, and a switching transistor, characterized in that a TiN film is formed between the upper electrode and a wiring electrode. The lower electrode may be made of Pt. The upper electrode may be made of one of $SrRuO$, $IrO_2$, $RuO_2$, and $LaSrCoO$. A Ti film may be formed between the wiring electrode and the TiN film.

A method of manufacturing a semiconductor storage device according to an aspect of the present invention, includes steps of: forming a first insulation film on a semiconductor substrate on which a switching transistor is formed; depositing a high melting point metal film, a ferroelectric material film, and an oxide conductive material film sequentially; forming an upper electrode by patterning the oxide conductive material film; patterning the ferroelectric material film and the high melting point metal film; forming a contact hole to the lower electrode by patterning the ferroelectric material film; forming a resist pattern after forming a second insulation film; exposing a part of the upper electrode and the lower electrode by etching the second insulation film to form an opening, using the resist pattern as a mask; forming TiN film on the substantially the whole surface; and selectively remaining the TiN film, only on the part exposed by the opening, by removing the resist pattern.

Another method of manufacturing a semiconductor storage device according to another aspect of the present invention, includes steps of: forming a first insulation film on a semiconductor substrate on which a switching transistor is formed; depositing a high melting point metal film, a ferroelectric film, and an oxide conductive material film sequentially; forming an upper electrode by patterning the oxide conductive material film; patterning the ferroelectric material film and the high melting ponit metal film; forming a contact hole to the lower electrode by patterning the ferroelectric material film; forming a resist pattern after forming a second insulation film then; exposing a part of the diffusion layer of the switching transistor by etching the second insulation film and the first insulation film to form an opening, using the resist pattern as a mask; forming Ti film substantially on the whole surface; selectively remaining Ti film remains, only on the exposed part of the opening, by removing the resist pattern; forming an opening to expose a part of the upper electrode and the lower electrode on the second insulation film; and forming TiN film above the exposed upper electrode and the exposed lower electrode.

Furthermore, another method of manufacturing a semiconductor storage device according to the other aspect of the present invention, includes steps of: forming a first insulation film on a semiconductor substrate on which a switching transistor is formed; depositing a high melting point metal film, a ferroelectric material film, and an oxide conductive material film sequentially; patterning the TiN film and oxide conductive material film at the same time to form an upper electrode; patterning the ferroelectric material film and the high melting point metal film; forming a contact hole to lower electrode by patterning the ferroelectric material film; forming a resist pattern after forming a second insulation film; exposing a part of the upper electrode and the lower electrode, and a part of diffusion layer of the switching transistor by etching the second insulation film to form an opening, using the resist pattern as a mask; and forming Ti film and wiring metal film on substantially the whole surface sequentially and patterning the films.

The lower electrode may be made of Pt. The upper electrode is made of one of SrRuO, $IrO_2$, $RuO_2$, and LaSrCoO. The wiring electrode film is made of Al alloy.

This summary of the invention does not necessarily describe all necessary features of the present invention. The present invention may also be a sub-combination of the above described features. The above and other features and advantages of the present invention will become more apparent from the following description of embodiments taken in conjunction with the accompanying drawings.

BRIEF DESCRIPTION OF THE DRAWINGS

FIG. 2 shows manufacturing processes of the first embodiment of the present invention in cross section views.

FIG. 3 shows manufacturing processes of the second embodiment of the present invention in cross section views.

FIG. 4 shows manufacturing processes of the third embodiment of the present invention in cross section views.

DETAILED DESCRIPTION OF THE INVENTION

The present invention will now be described based on the preferred embodiments, which do not intend to limit the scope of the present invention, but exemplify the invention. All of the features and the combinations thereof described in the embodiment are not necessarily essential to the invention.

1. First Embodiment

Figure 1:
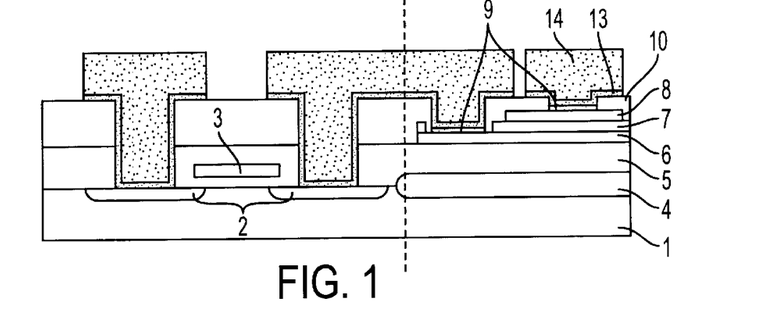
FIG. 1 is a cross sectional view showing a configuration of a semiconductor device according to an embodiment of the present invention.

FIG. 1 is a schematic sectional view showing a configuration of a device part of a 1T1C type semiconductor storage device consisting of one transistor and one ferroelectric capacitor. Here, 1T1C type is described as an example, but the present embodiment can also be applied to a 2T2C type device consisting of two transistors and two capacitors, where one more same type device is added, or other combinations. This structure is characterized in that it has an upper electrode 8 stacked on a ferroelectric material 7 made by a conductive oxide material, and a TiN film is accumulated, as an upper layer, on the upper electrode 8.

Referring to the figures, steps of a manufacturing method or process of a semiconductor device of the above described construction as the first embodiment of the present invention is described as follows.

At first, an MOS transistor, including diffusion layer 2, gate 3, and a gate oxide film not shown in the figures, is formed on silicon substrate 1 using a known technology. Each of the MOS transistors is separated and insulated by field oxide film 4. On this silicon substrate 1, first interlayer dielectric film 5 is deposited using a known technology.

Figure 2A:
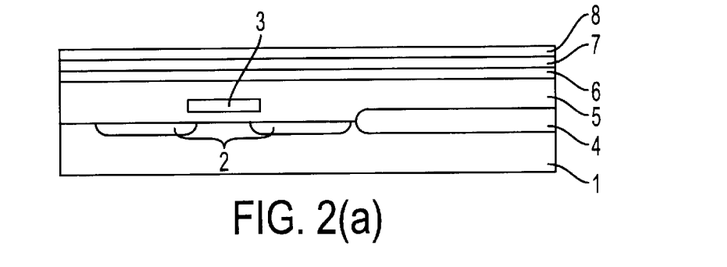
FIG. 2(a) shows stacked materials.

Subsequently, as shown in FIG. 2(a), on this first interlayer dielectric film 5, layers of Pt as lower electrode 6 for a ferroelectric capacitor, ferroelectric material 7, and SrRuO as upper electrode 8 are sequentially formed using a known technology. Here, as an example, SrRuO is used as a conductive oxide material film of upper electrode 8; however, $IrO_2$, $RuG_2$, LaSrCoO, and other obvious conductive oxides can also be applied.

Figure 2B:
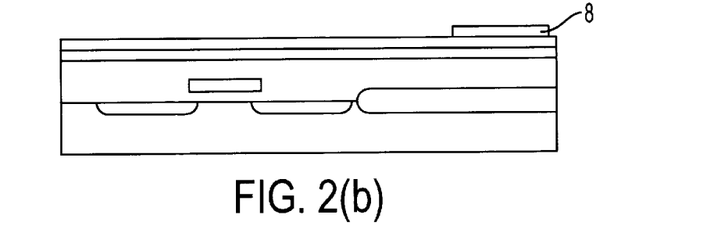
FIG. 2(b) shows a process of etching upper electrode 8.
Figure 2C:
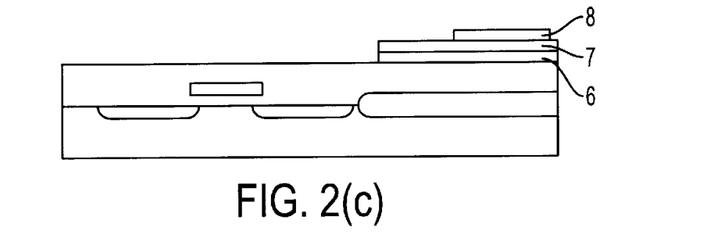
FIG. 2(c) shows a process of etching ferroelectric material 7 and lower electrode 6.

Next, as shown in FIG. 2(b), upper electrode 8 is patterned. Here, as an example, using a resist not shown in the figures as a mask, it is processed by a dry etching method with a mixed gas consisting of $Cl_2$ and Ar. In the next step, as shown in FIG. 2(c), using a resist formed to cover the upper electrode 8, also not shown in the figures, as a mask, ferroelectric material 7 and lower electrode 6 are processed using only one dry etching process with a mixed gas consisting of HBr, Ar, $CHF_3$, and $Cl_2$.

Figure 2D:
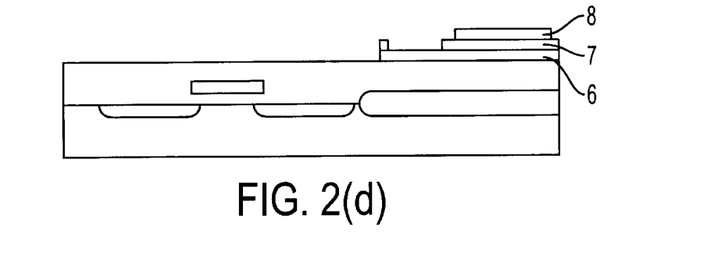
FIG. 2(d) shows a process of forming a contact hole.

A contact hole is formed in ferroelectric material 7 in order to contact lower electrode 6 with the diffusion layer of the MOS transistor as shown in FIG. 2(d). Here, as an example, using a resist as a mask, the contact hole is formed using a dry etching method with mixed gas consisting of HBr, Ar, and $CHF_3$ (a ferroelectric material opening etching).

Figure 2E:
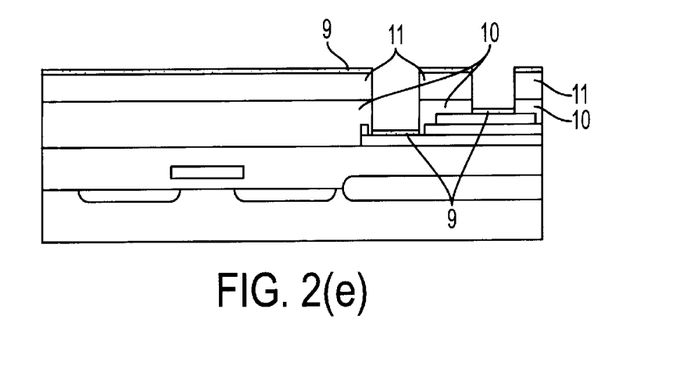
FIG. 2(e) shows a process of forming contact holes and a TiN film.
Figure 2F:
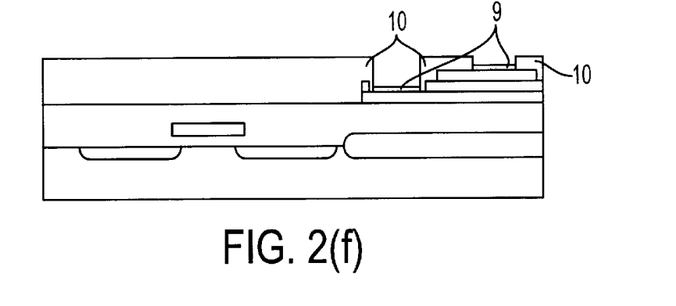
FIG. 2(f) shows a process of resist stripping.
Figure 2G:
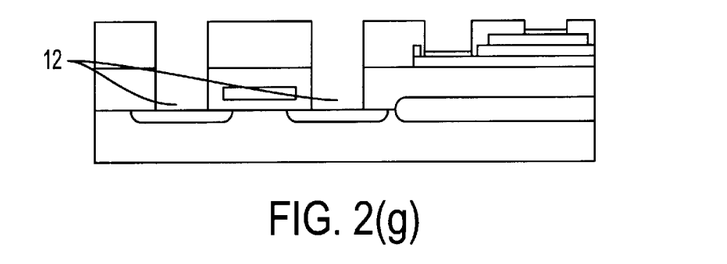
FIG. 2(g) shows a process of forming diffusion layer contact 12.
Figure 2H:
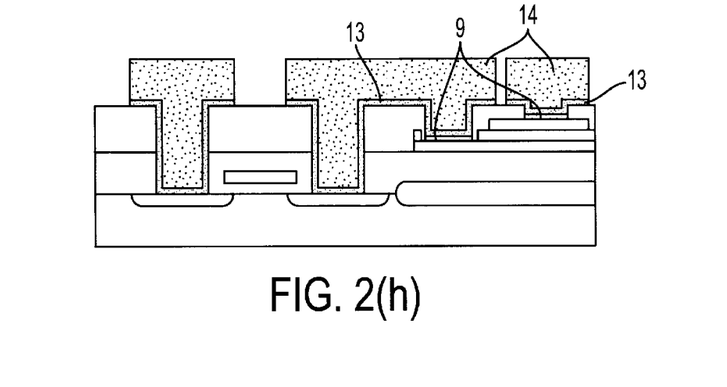
FIG. 2(h) shows a process of wiring.

A structure of a ferroelectric capacitor is formed by the processes described above. After forming the second interlayer dielectric film 10, a contact hole, to upper electrode 8 and lower electrode 6 of the ferroelectric capacitor, is formed. Here, as an example, using resist mask 11, a contact hole is formed by a dry etching method with fluorocarbon gas such as $CHF_3$. TiN film 9 is then formed by a known reactive sputtering method as shown in FIG. 2(*e*). These processes form TiN film, which is less oxidizable than the Ti film, on the conductive oxide electrode material used for the upper electrode. At the same time, TiN film is also formed on the opening of the lower electrode.

Next, resist stripping is performed where TiN film except in the bottom of the contact holes is removed by the known lift-off method as shown in FIG. 2(*f*). Then, diffusion layer contact 12 to silicon substrate 1 is formed as shown in FIG. 2(*g*). Thus, each of Ti film 13 and Al film 14 are sequentially deposited in order to connect wiring; and patterning is performed by a known method to form a wiring (FIG. 2(*h*)). Here, TiN film can also be formed between Ti film 13 and Al film 14.

According to the first embodiment described above, after forming the contact holes to the upper electrode and the lower electrode of the ferroelectric capacitor and forming the TiN film 9 by the sputtering method, TiN film 9 remains in the bottom of the contact, and other parts of TiN film 9 are removed. Therefore, the formation of $TiO_X$ on the conductive oxide electrode and the occurrence of peeling can be prevented. The bottom of diffusion layer contact 12 to diffusion layer 2 is formed by multilayer metal Ti film 13 and Al film 14, and loose contact of silicon substrate 1 can be prevented.

2. Second Embodiment

The second embodiment is aimed to simplify the processes of the first embodiment.

Figure 3A:
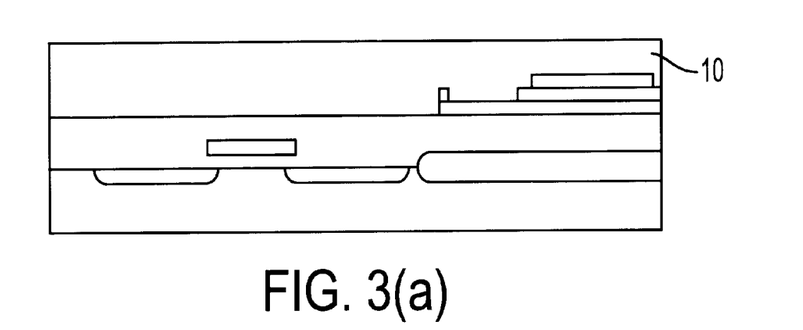
FIG. 3(a) shows a process of forming second interlayer dielectric film 10.
Figure 3B:
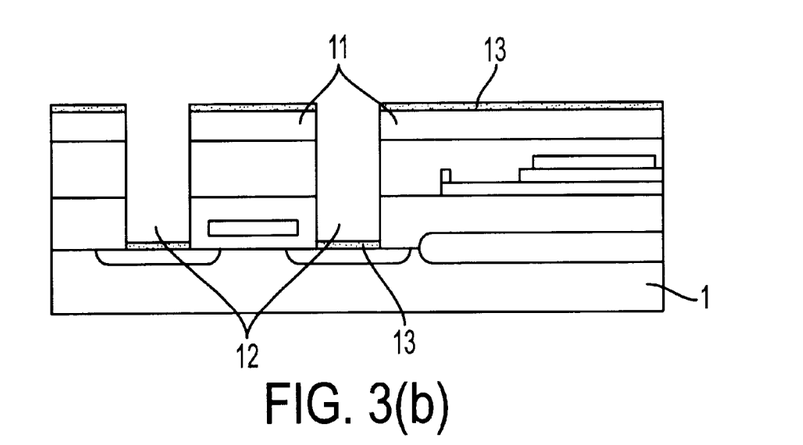
FIG. 3(b) shows a process of forming diffusion layer contact 12 and Ti film 13.
Figure 3C:
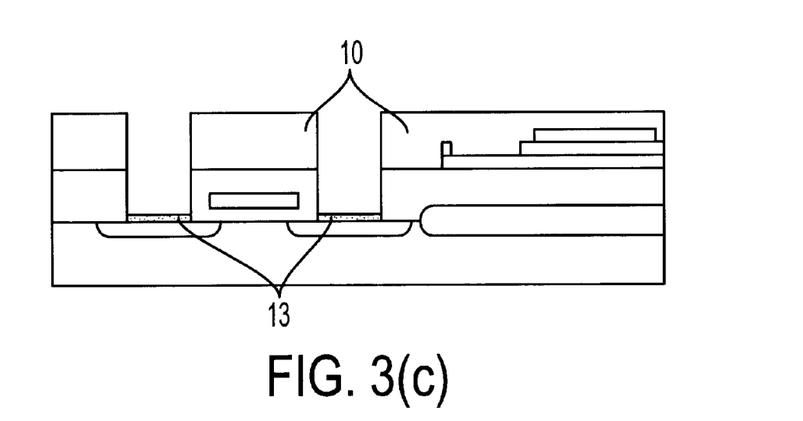
FIG. 3(c) shows a process of lifting off excess Ti film.
Figure 3D:
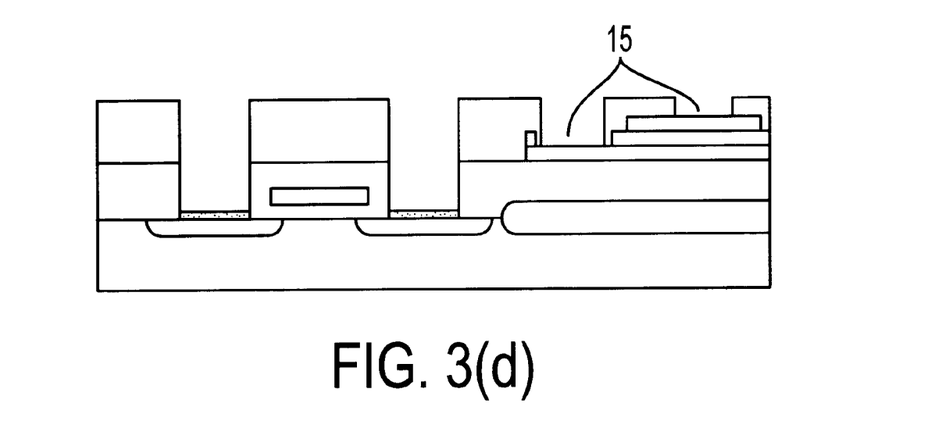
FIG. 3(d) shows a process of forming contact to ferroelectric material 15.
Figure 3E:
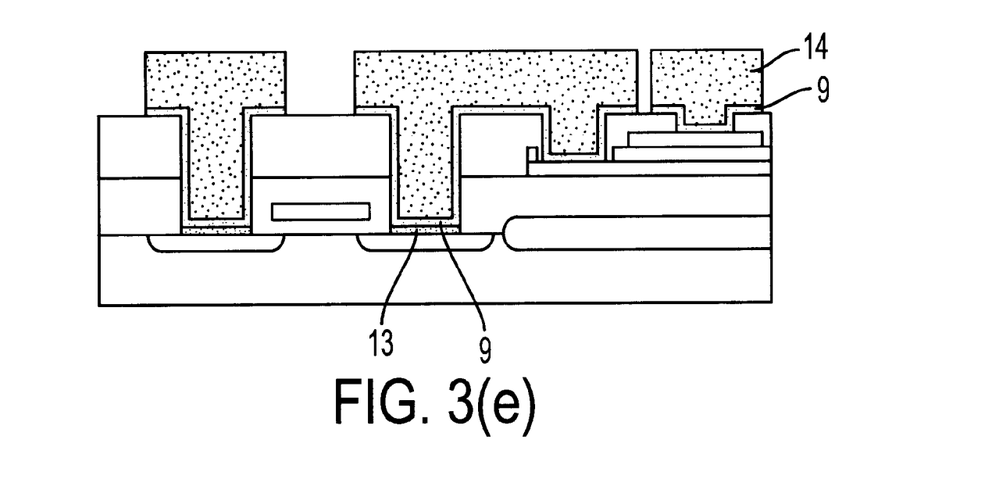
FIG. 3(e) shows a process of wiring.

Processes up to the step shown in FIG. 2(*d*) are omitted because they are the same as the manufacturing processes according to the first embodiment. After forming the capacitor structure, second interlayer dielectric film 10 is formed as shown in FIG. 3(*a*).

After diffusion layer contact 12 to silicon substrate 1 is formed by dry etching using resist mask 11, Ti film 13 is formed by a sputtering method as shown in FIG. 3(*b*). Then, only the Ti film remains in the bottom of the contact hole as illustrated in FIG. 3(*c*), and the Ti film on the other parts is removed by the lift-off method.

Subsequently, as shown in FIG. 3(*d*), contacts 15 for ferroelectric material to the upper electrode and lower electrode of the ferroelectric capacitor are formed, and then, TiN film 9 and Al film 14 are deposited by a well known method, and a sputtering method is performed on them. As a result, a multilayer wiring is thus formed as depicted in FIG. 3(*e*).

As described above, according to the second embodiment, diffusion layer contact 12 to diffusion layer 2 is formed first; Ti film 13 is selectively formed on diffusion layer 2 so that good contact to silicon substrate 1 is accomplished; and contact 15 for ferroelectric material is formed, TiN film 9 and Al film 14 are sequentially formed and sputtering is performed on them, and a multilayer wiring is formed. Therefore, compared to the first embodiment, the second embodiment can dispense with one sputtering process of TiN film so that the manufacturing process is simplified, and a reduction of costs and enhancement of yields can be realized.

3. Third Embodiment

The third embodiment is a method to form good contact without using the known lift-off method.

Figure 4A:
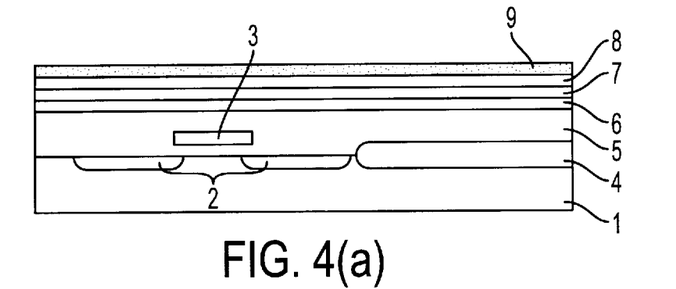
FIG. 4(a) shows stacked materials.
Figure 4B:
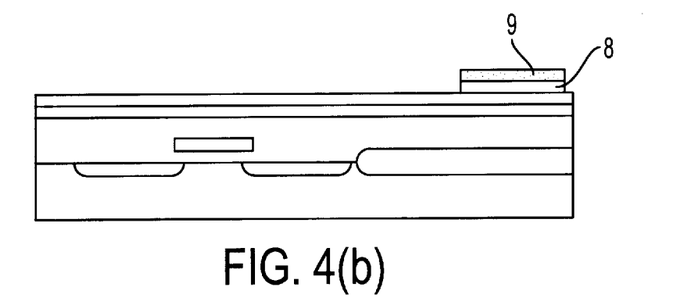
FIG. 4(b) shows a process of patterning a TiN film and upper electrode 8.
Figure 4C:
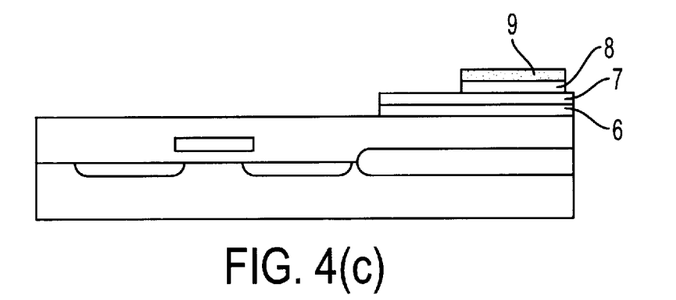
FIG. 4(c) shows a process of patterning lower electrode 6 and ferroelectric material 7.
Figure 4D:
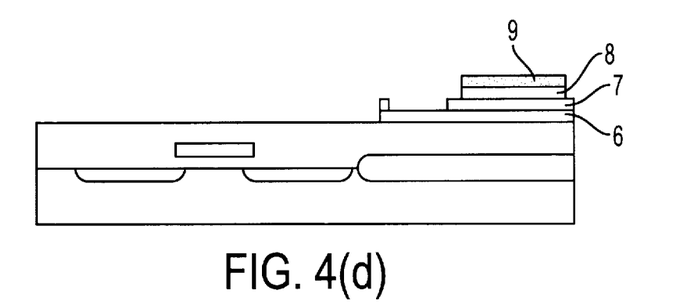
FIG. 4(d) shows a process of forming a contact hole.

As in the first embodiment, a MOS transistor, constructed of diffusion layer 2, gate 3, and a gate oxide film not shown in the figures, is formed on silicon substrate 1 by a known N technology. Each of the MOS transistors is insulated and separated by filed oxide film 4. On this silicon substrate 1, first interlayer dielectric film 5 is deposited by a known technology.

On this silicon substrate 1, Pt as lower electrode 6 of the ferroelectric capacitor, ferroelectric material 7, and SrRuO as upper electrode 8 are sequentially formed by a known technology. A TiN film is formed by sputtering substantially the whole surface of the wafer as illustrated in FIG. 4(*a*).

Then, as shown in FIG. 4(*b*), using an upper mask pattern not shown in the figures, a TiN film and upper electrode 8 made of conductive oxide are patterned at the same time.

Ferroelectric film 7 and lower electrode 6 are patterned by a well known method to form a ferroelectric capacitor structure as illustrated in FIG. 4(*c*).

Then, a contact hole for a lower electrode of the capacitor structure is opened by a well known method as shown in FIG. 4(*d*).

Figure 4E:
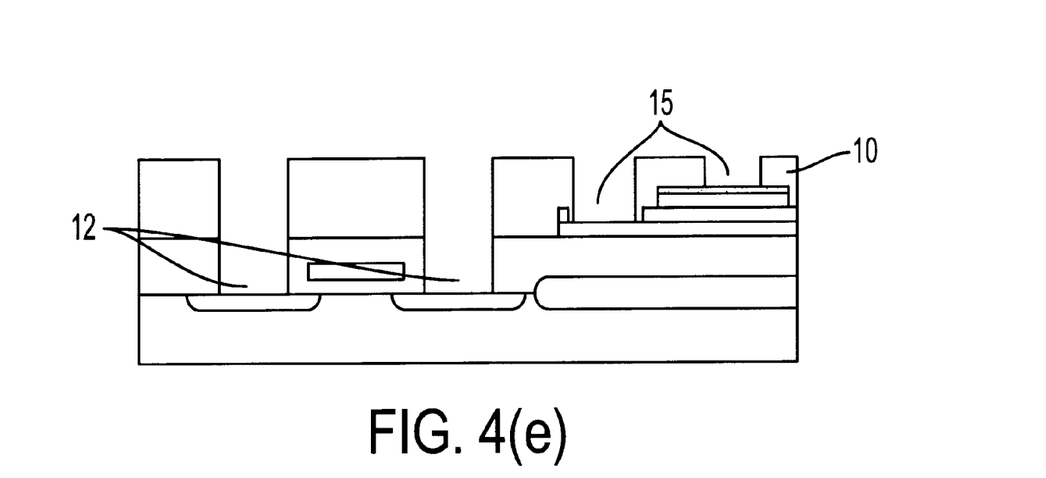
FIG. 4(e) shows a process of depositing second interlayer dielectric 10 and forming contact to ferroelectric material 15.
Figure 4F:
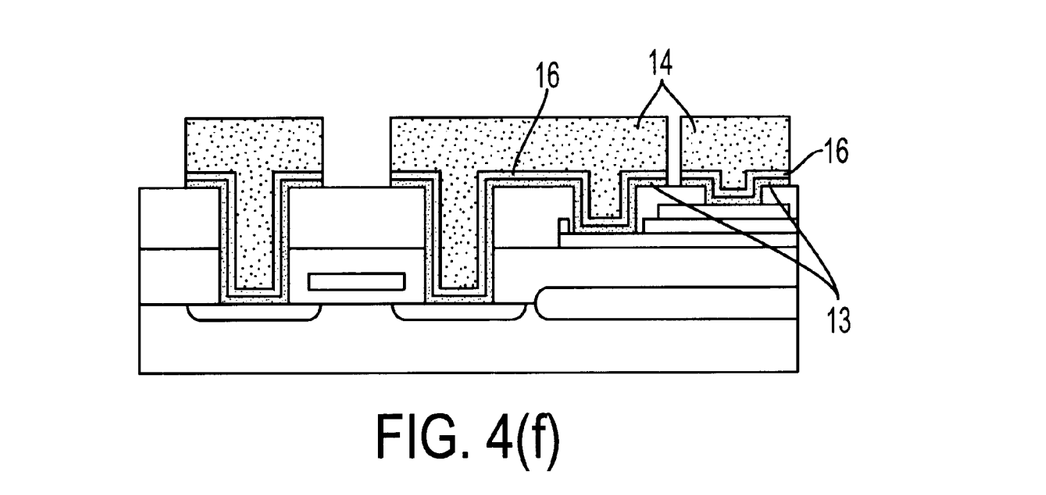
FIG. 4(f) shows a process of forming a laminated thin film and wiring.

Second interlayer dielectric film 10 is deposited on substantially the whole surface of the wafer. Diffusion layer contact 12 to the diffusion layer of silicon substrate 1 and contact to ferroelectric material 15 occurs as shown in FIG. 4(*e*)

After Ti film 13, second TiN film 16, and Al film 14 are sequentially formed on substantially the whole surface of the wafer, a well known patterning is performed on it, and a laminated thin film of Ti, TiN, and Al is formed as illustrated in FIG. 4(*f*).

According to the third embodiment described above, TiN film 9 was previously formed on the upper electrode (conductive oxide electrode). Hence, when the laminated thin film of Ti, TiN, and Al is sputtered, a film of Ti, TiN, and Al is deposited on the diffusion layer of the Si substrate; on the other hand, a film of TiN, Ti, TiN, and Al is deposited on the upper electrode (conductive oxide electrode). Therefore, it is advantageous in that both of the contacts can be maintained, and at the same time, manufacturing processes can be simplified.

As a result, according to the third embodiment of the present invention, it is obvious that manufacturing costs can be reduced while yield can be enhanced. In the meantime, because this does not use the lift-off method, the method has a good congeniality with the general performance of Si processes. Furthermore, the forming of second TiN film 16 can be omitted, in which case the processes can be simplified.

Although the present invention has been described by way of exemplary embodiments, it should be understood that many changes and substitutions may be made by those skilled in the art without departing from the spirit and the scope of the present invention which is defined only by the appended claims.

What is claimed is:

1. A method of manufacturing a semiconductor storage device comprising steps of:

forming a first insulation film on a semiconductor substrate on which a switching transistor is formed;

depositing on said first insulation film a high melting point metal film, to serve as a lower electrode, a ferroelectric material film, and an oxide conductive material film sequentially;

patterning said oxide conductive material film to form an upper electrode;

patterning together said ferroelectric material film and said high melting point metal film;

forming a contact hole to the lower electrode by patterning said ferroelectric material film;

forming a resist pattern after forming a second insulation film over substantially the entire surface, said resist pattern having at least one gap over at least a part of each of said upper electrode and said lower electrode;

exposing a part of said upper electrode and said lower electrode by etching said second insulation film to form an opening over each of said upper electrode and said lower electrode, using said resist pattern as a mask;

forming TiN film on the substantially whole surface; and selectively leaving said TiN film only on the parts exposed by said openings over said upper electrode and said lower electrode, by removing the resist pattern;

depositing a Ti film and a wiring metal film sequentially over substantially the entire surface and patterning the films.

2. A manufacturing method of a semiconductor storage device as claimed in claim 1, wherein said lower electrode is made of Pt.

3. A manufacturing method of a semiconductor storage device as claimed in claim 1, wherein said upper electrode is made of at least one of SrRuO, $IrO_2$, $RuG_2$, and LaSrCoO.

4. A method of manufacturing a semiconductor storage device comprising steps of:

forming a first insulation film on a semiconductor substrate on which a switching transistor is formed;

depositing on said first insulation film a high melting point metal film, to serve as a lower electrode, a ferroelectric material film, and an oxide conductive material film sequentially;

patterning said oxide conductive material film to form an upper electrode;

patterning together said ferroelectric material film and said high melting point metal film;

forming a contact hole to the lower electrode by patterning said ferroelectric material film;

forming a resist pattern after forming a second insulation film over substantially the entire surface, the resist pattern containing at least one gap over at least one part of a diffusion layer of said switching transistor, then;

exposing a part of the diffusion layer of said switching transistor by etching said second insulation film and said first insulation film to form at least one first opening, using said resist pattern as a mask;

forming Ti film on substantially the whole surface; and selectively leaving said Ti film only on the exposed part of said at least one first opening, by removing said resist pattern;

forming second openings in said second insulation film to expose a part of said upper electrode and a part of said lower electrode forming TiN film on substantially the entire surface; and selectively leaving said TiN film substantially only on said at least one first opening and on said second openings.

5. A manufacturing method of a semiconductor storage device as claimed in claim 4, wherein said lower electrode is made of Pt.

6. A manufacturing method of a semiconductor storage device as claimed in claim 4, wherein said upper electrode is made of at least one of SrRuO, $IrO_2$, $RuO_2$, and LaSrCoO.

7. A method of manufacturing a semiconductor storage device comprising steps of:

forming a first insulation film on a semiconductor substrate on which a switching transistor is formed;

depositing on said first insulation film a high melting point metal film, to serve as a lower electrode, a ferroelectric material film, and an oxide conductive material film sequentially;

forming a TiN film over substantially the entire surface;

patterning the TiN film and said oxide conductive material film at the same time to form an upper electrode;

patterning together said ferroelectric material film and said high melting point metal film;

forming a contact hole to the lower electrode by patterning said ferroelectric material film;

forming a resist pattern over substantially the entire surface after forming a second insulation film over substantially the entire surface, said resist pattern including at least one gap over at least a part of a diffusion layer of said switching transistor and including gaps over at least parts of said upper electrode and said lower electrode;

exposing a part of said upper electrode and said lower electrode, and a part of the diffusion layer of said switching transistor by etching said second insulation film to form an opening, using said resist pattern as a mask; and forming Ti film and wiring metal film on substantially the whole surface sequentially and patterning the films.

8. A manufacturing method of a semiconductor storage device as claimed in claim 7, wherein said wiring metal film is made of Al alloy.

9. A manufacturing method of a semiconductor storage device as claimed in claim 7, wherein said lower electrode is made of Pt.

10. A manufacturing method of a semiconductor storage device as claimed in claim 7, wherein said upper electrode is made of at least one of SrRuO, $IrO_2$, $RuO_2$, and LaSrCoO.

* * * * *